United States Patent
Andry et al.

(10) Patent No.: US 8,440,544 B2
(45) Date of Patent: May 14, 2013

(54) CMOS STRUCTURE AND METHOD OF MANUFACTURE

(75) Inventors: Paul S. Andry, Yorktown Heights, NY (US); Edmund J. Sprogis, Underhill, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/899,127

(22) Filed: Oct. 6, 2010

(65) Prior Publication Data

US 2012/0086100 A1   Apr. 12, 2012

(51) Int. Cl.
*H01L 21/301* (2006.01)

(52) U.S. Cl.
USPC .................................. 438/464; 257/E21.122

(58) Field of Classification Search .................. 438/465, 438/976
See application file for complete search history.

(56) References Cited

U.S. PATENT DOCUMENTS

| | | | |
|---|---|---|---|
| 4,875,086 A | 10/1989 | Malhi et al. | |
| 5,258,236 A | 11/1993 | Arjavalingam et al. | |
| 5,343,064 A | 8/1994 | Spangler et al. | |
| 5,414,276 A | 5/1995 | McCarthy | |
| 6,103,009 A | 8/2000 | Atoji | |
| 6,548,391 B1 | 4/2003 | Ramm et al. | |
| 6,673,694 B2 | 1/2004 | Borenstein | |
| 6,774,010 B2 * | 8/2004 | Chu et al. | 438/458 |
| 6,864,156 B1 | 3/2005 | Conn | |
| 6,911,375 B2 * | 6/2005 | Guarini et al. | 438/455 |
| 7,262,088 B2 * | 8/2007 | Kodaira et al. | 438/197 |
| 7,265,030 B2 | 9/2007 | Maa et al. | |
| 7,560,802 B2 | 7/2009 | Kalvesten et al. | |
| 7,615,456 B2 | 11/2009 | Akiyama et al. | |
| 7,622,362 B2 | 11/2009 | Katou | |
| 2008/0308143 A1 | 12/2008 | Atanackovic | |
| 2009/0117704 A1 | 5/2009 | Yamazaki et al. | |

OTHER PUBLICATIONS

Shuangwu et al., "Temporary Bonding of Wafer to Carrier for 3D-Wafer Level Packaging", 2008 10th Electronics Packaging Technology Conference, pp. 405-411.

* cited by examiner

*Primary Examiner* — Chandra Chaudhari
(74) *Attorney, Agent, or Firm* — Anthony Canale; Roberts Mlotkowski Safran & Cole, P.C.

(57) ABSTRACT

CMOS structures with a replacement substrate and methods of manufacture are disclosed herein. The method includes forming a device on a temporary substrate. The method further includes removing the temporary substrate. The method further includes bonding a permanent electrically insulative substrate to the device with a bonding structure.

21 Claims, 4 Drawing Sheets

US 8,440,544 B2

CMOS STRUCTURE AND METHOD OF MANUFACTURE

FIELD OF THE INVENTION

The invention relates to semiconductor structures and methods of manufacture and, more particularly, to building CMOS structures on a standard substrate which is subsequently replaced with a second substrate, and methods of manufacture.

BACKGROUND

High performance silicon components are a very important technology for consumer electronics, such as in the front end module (FEM) of a cellular telephone. For example, the FEM includes switches, power Amps, controllers, filters, etc. Currently, this technology space is almost exclusively GaAs; however, significant inroads are now being made into this space with Silicon on Sapphire (SoS). Due to the insulating nature of sapphire substrates, semiconductor devices formed on the surface have excellent isolation and thermal dissipation, resulting in ultra high performance. However, processing on sapphire wafers is difficult and very expensive. For example, processing of active or passive devices on sapphire wafers does not use conventional SOI semiconductor fabrication processes, which adds to the complexity and costs of fabrication.

Accordingly, there exists a need in the art to overcome the deficiencies and limitations described hereinabove.

SUMMARY

In a first aspect of the invention, a method comprises forming a device on a temporary substrate. The method further comprises removing the temporary substrate from the device and bonding a permanent electrically insulative substrate to the device with a bonding structure, in place of the temporary substrate.

In another aspect of the invention, a method comprises forming a device on a temporary substrate. The method further comprises attaching a releasable wafer to the device on an opposing side to the temporary substrate. The method further comprises removing the temporary substrate from the device and bonding a permanent electrically insulative substrate to the device with a bonding structure. The permanent electrically insulative substrate provided in place of the temporary substrate. The method further comprises removing the releasable wafer after bonding of the permanent electrically insulative substrate.

In yet another aspect of the invention, a structure comprises a permanent electrically insulative substrate bonded to a device with a high temperature adhesive that can withstand temperatures of up to about 350° C.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the CMOS structure, which comprises the structures of the present invention. In still further embodiments, a method in a computer-aided design system is provided for generating a functional design model of the CMOS structure. The method comprises generating a functional representation of the structural elements of the CMOS structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to CMOS structures with a replacement substrate layer and methods of manufacture. More specifically, the present invention is directed to high performance CMOS structures and fabrication processes, where the fabrication processes include replacing a temporary silicon substrate with an insulator substrate such as, for example, a sapphire substrate.

Advantageously, by implementing the processes of the present invention, it is not necessary to build a device or structure directly on a sapphire substrate, which adds considerable costs to the manufacturing processes, as such processes do not use conventional semiconductor fabrication processes. Instead, the present invention utilizes conventional semiconductor fabrication processes for building a structure, e.g., active or passive devices, on a silicon substrate, then replacing the silicon substrate with an insulator material such as, for example, a sapphire substrate. This considerably reduces costs and complexities of building high performance CMOS structures.

More specifically, in embodiments, after formation of circuitry or other structure on a layer of an SOI wafer (using conventional fabrication processes), the method of the present invention includes attaching an electrically insulative substrate (e.g., glass) on an upper surface of the circuitry or other structure on the SOI wafer. The SOI wafer is removed, and a replacement electrically insulative substrate (e.g., glass, sapphire, etc.) is attached to the circuitry or other structure with an adhesive, epoxy or other bonding method. In embodiments, the replacement electrically insulative substrate can be attached to a remaining surface of the SOI wafer, if the entire SOI wafer was not removed. The electrically insulative substrate on the upper surface of the circuitry or other structure can be removed by, for example, laser ablation, as described in U.S. Pat. No. 5,258,236, which contents are incorporated herein by reference in their entirety. In this way, the present invention provides a lower cost method of fabricating a high performance CMOS structure with a layer that improves characteristics of the structure, e.g., thermal conductivity of the structure.

Figure 1:
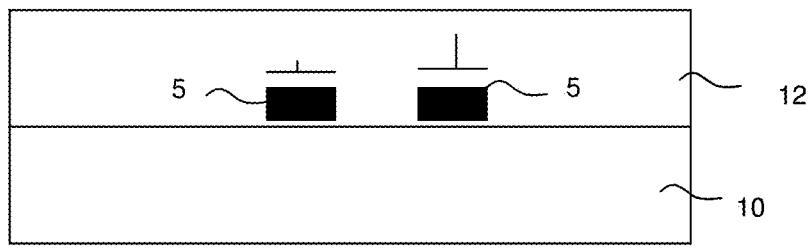
FIGS. 1-6 show several structures and respective processing steps in accordance with aspects of the present invention.

FIG. 1 shows a structure in accordance with aspects of the present invention. In particular, device layer 12 includes an active or passive device 5 formed on a substrate 10 using conventional semiconductor processes. The substrate 10 can be, for example, a SOI wafer or Si substrate. The total thickness of device layer 12 and substrate 10 can be about 700 microns thick, although other dimensions are also contemplated by the present invention. Device layer 12 can contain an active device such as, for example, a N-type device or a P-type device. Device layer 12 can also contain passive device(s) such as, for example, resistors, capacitors, diodes, wires, and interconnects, etc.

Figure 2:
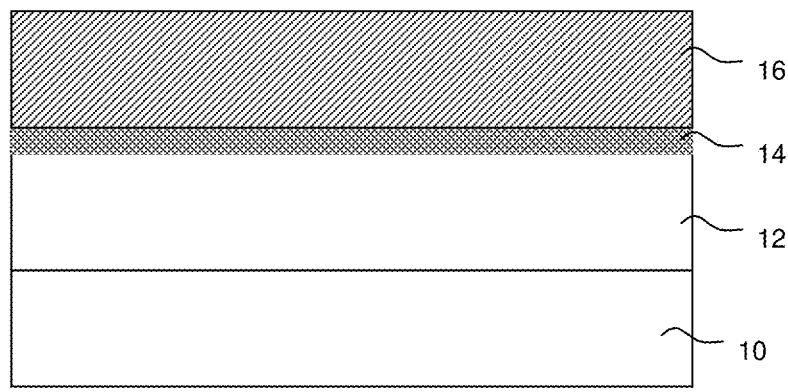

In FIG. 2, a releasable adhesive or other releasable bonding agent 14 attaches a temporary handler wafer 16 to the device layer 12. More specifically, the temporary handler wafer 16, which can be removed in later processing steps, can be, for example, a glass handler or other releasable substrate. The adhesive or other bonding agent 14 can be, for example, a high temperature releasable adhesive, which can withstand temperatures to about 350° C. The adhesive or other bonding agent 14 can be materials such as, for example, an epoxy based material, polyimide adhesive based material, a thermal plastic adhesive, acrylic based dissolvable adhesive or other releasable agents. In embodiments, the adhesive or other bonding agent 14 can be removed by, for example, mechanical grinding and/or chemical solutions, known to those of skill in the art.

Figure 3:
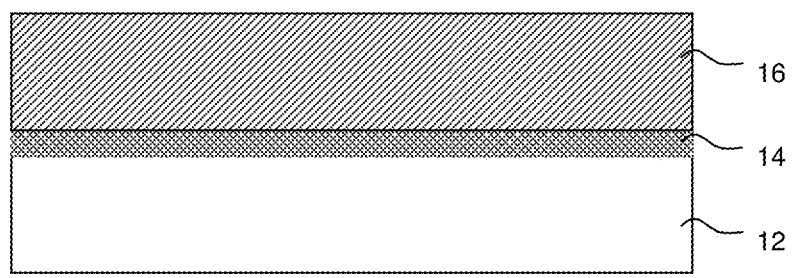

As shown in FIG. 3, the substrate 10 is removed from device layer 12. The removal process can be accomplished by grinding of the BULK or wafer and wet etching processes. For example, the grinding will remove the majority of the substrate, with wet etching removing the remaining portions. In embodiments, the wet etching can include potassium hydroxide, Tetramethylammonium hydroxide (TMAH or TMAOH) or hydrofluoric acid (HF) and nitric acid ($HNO_3$) chemistries. In embodiments, some of the substrate 10 can remain on the device 12.

Figure 4:
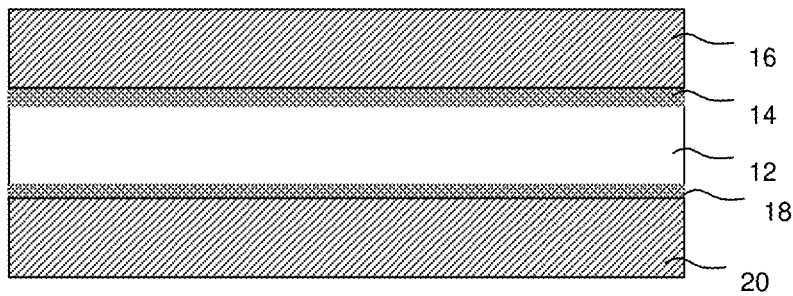

In FIG. 4, a replacement substrate 20 is attached to the device layer 12 using a bonding structure (or substance) generally shown at reference numeral 18. The bonding structure (or substance) 18 can be, for example, a high temperature adhesive that can withstand temperatures of up to about 350° C. The bonding structure (or substance) 18 can be, for example, an epoxy based material, polyimide adhesive based material, a thermal plastic adhesive, or acrylic based adhesive. In embodiments, the bonding structure (or substance) 18 can be an oxide to oxide structure or an oxide to nitride structure, well known to those of skill in the art. For example, an oxide may be formed on each facing surface of the device layer 12 and substrate 20. The two oxide surfaces can be placed together, attracted by van der Waals forces. The structure can then undergo a high temperature annealing process to stabilize the bond. In embodiments, the bonding structure (or substance) 18 can be about 10 microns to 20 microns in thickness; although other dimensions are also contemplated by the present invention. This same type of process can be used for an oxide to nitride structure. The bonding structure (or substance) 18 can also improve characteristics of the structure, e.g., thermal conductivity of the structure.

Still referring to FIG. 4, the replacement substrate 20 can be, for example, glass, sapphire or other electrically insulative material. In embodiments, the replacement substrate 20 has a thickness of about 700 microns to about 750 microns. In further embodiments, the replacement substrate 20 has a coefficient of thermal expansion close to that of device layer 12, to prevent cracking or delamination of device layer 12. The replacement substrate 20 provides thermal heat dissipation to the device layer 12, as well as reduces parasitic capacitance to the terminals of device layer 12. Accordingly, the replacement substrate 20 will increase device performance.

Figure 5:
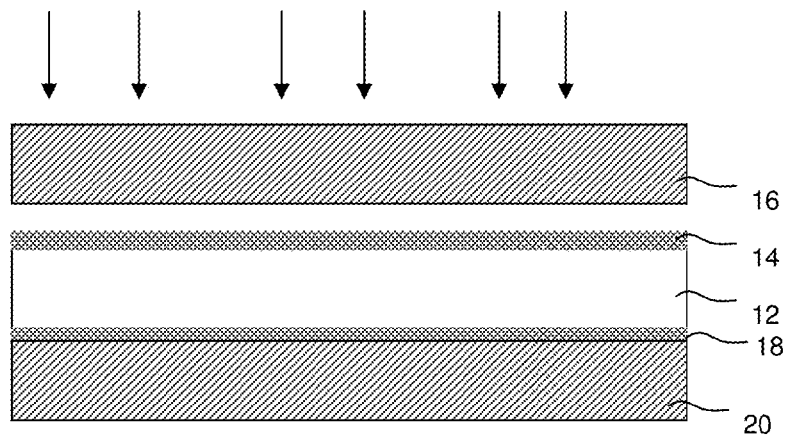

In FIG. 5, the temporary handler wafer 16 is removed or released from the releasable adhesive or other bonding agent 14. For example, through a laser ablation process as disclosed in U.S. Pat. No. 5,258,236, the bond between the releasable adhesive or other bonding agent 14 and the temporary handler wafer 16 can be broken. A chemistry can also remove the temporary handler wafer 16, as should be known to those of skill in the art. Once the bond is broken, the temporary handler wafer 16 can be removed from the structure, i.e., adhesive or other bonding agent 14.

Figure 6:
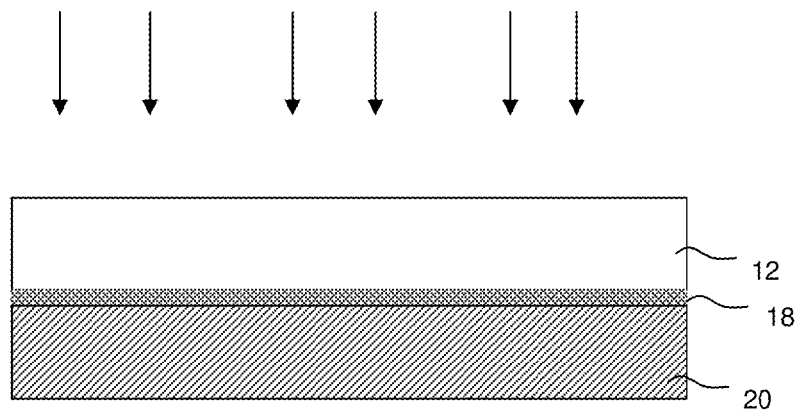

In FIG. 6, the releasable adhesive or other bonding agent 14 is removed. In embodiments, the releasable adhesive or other bonding agent 14 can be removed using an ashing process. In semiconductor manufacturing, plasma ashing is the process of removing a photoresist or other structure from a device. Using a plasma source, a monatomic reactive species is generated. Oxygen or fluorine is the most common reactive species. The reactive species combines with the releasable adhesive or other bonding agent 14 to form ash which is removed with a vacuum pump. Typically, monatomic (single atom) oxygen plasma is created by exposing oxygen gas ($O_2$) to non-ionizing radiation. This process is performed under vacuum to create plasma.

Figure 7:
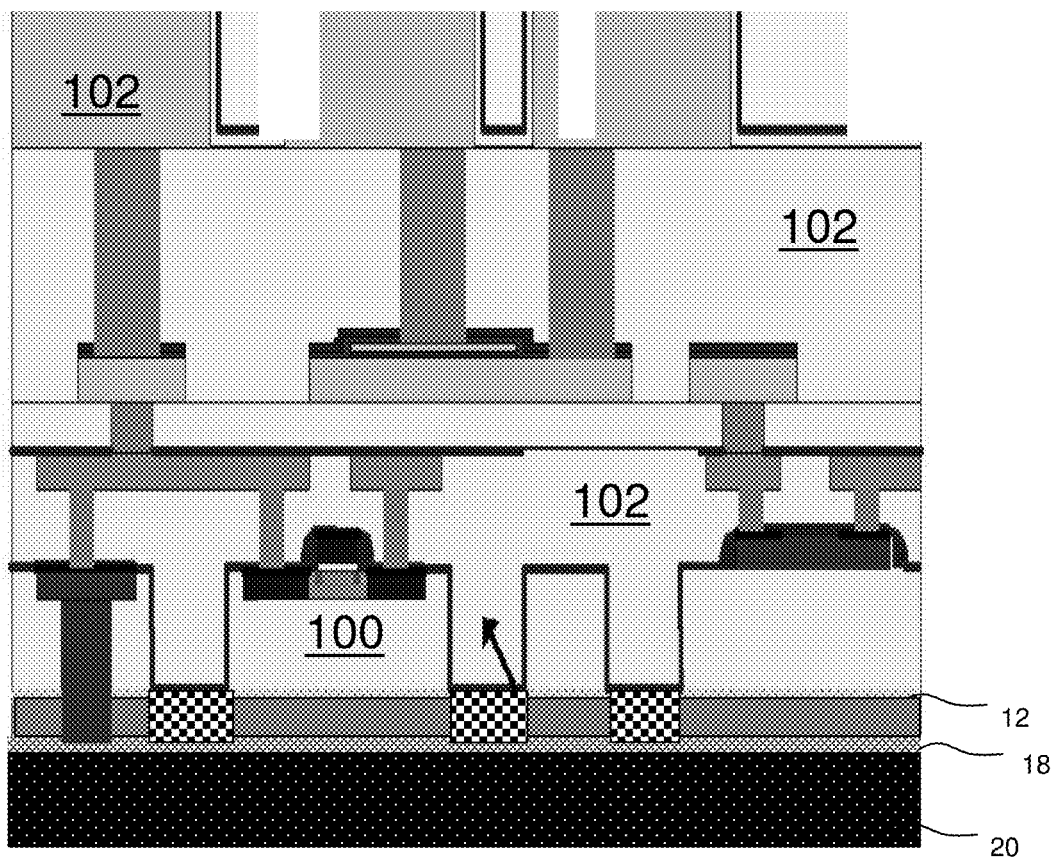
FIG. 7 shows an exemplary structure in accordance with aspects of the present invention.

FIG. 7 is representative of an exemplary embodiment showing an illustrative device layer 12 bonded to the substrate 20. As shown, the device in layer 12 includes an NFET device 100, resistor, interconnects and metal layers 102. It should be understood though that other devices are also contemplated by the present invention.

Figure 8:
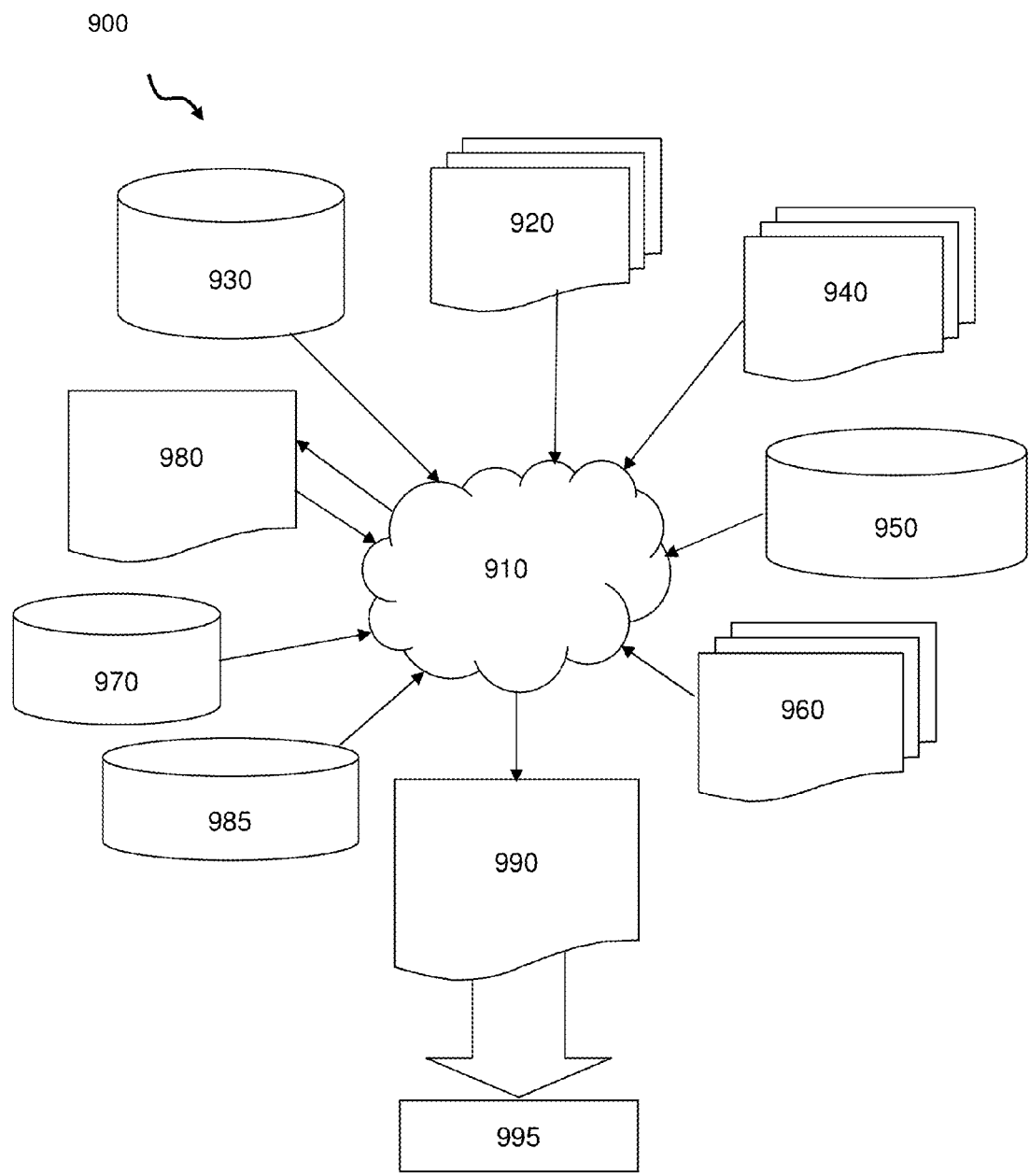
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a device in a device layer on a temporary substrate;
   removing the temporary substrate from the device layer by grinding and wet etching processes; and
   bonding a permanent electrically insulative substrate to the device layer with a bonding structure, in place of the temporary substrate,
   wherein the device layer and the permanent electrically insulative substrate have about a same coefficient of thermal expansion.

2. The method of claim 1, wherein the bonding structure is a high temperature adhesive.

3. The method of claim 2, wherein the high temperature adhesive can withstand temperatures to about 350° C.

4. The method of claim 1, wherein the bonding structure is an epoxy.

5. The method of claim 1, wherein the bonding structure is an oxide to oxide bond, which includes forming oxide on a surface of the device layer and permanent electrically insulative substrate, and undergoing a high temperature annealing process.

6. The method of claim 1, wherein the bonding structure is an oxide to nitride bond which includes forming one of an oxide and nitride on a surface of the device layer and permanent electrically insulative substrate, respectively, and undergoing a high temperature annealing process.

7. The method of claim 1, further comprising attaching a releasable wafer to the device layer by an adhesive, prior to the bonding of the permanent electrically insulative substrate.

8. The method of claim 7, wherein the adhesive is a releasable adhesive.

9. The method of claim 8, wherein the releasable adhesive is a high temperature releasable adhesive that can withstand temperatures to about 350° C.

10. The method of claim 7, wherein the releaseable wafer is released from the adhesive by laser ablation and the adhesive is removed by grinding and etching processes.

11. The method of claim 10, wherein the etching is a wet etch.

12. A method, comprising:
    forming a device in a device layer on a temporary substrate;
    attaching a releasable wafer to the device layer on an opposing side to the temporary substrate;
    removing the temporary substrate from the device layer;
    bonding a permanent electrically insulative substrate to the device layer with a bonding structure, the permanent electrically insulative substrate being in place of the temporary substrate; and
    removing the releasable wafer after bonding of the permanent electrically insulative substrate,
    wherein:
       the releasable wafer is removed by laser ablation;
       the bonding structure is removed by grinding and etching processes; and
       the device layer and the permanent electrically insulative substrate have about a same coefficient of thermal expansion.

13. The method of claim 12, wherein the releasable wafer is attached using a releaseable adhesive bonded between the device layer and the releasable wafer.

14. The method of claim 13, wherein the releasable adhesive is a high temperature releasable adhesive that can withstand temperatures to about 350° C.

15. The method of claim 12, wherein the permanent electrically insulative substrate is sapphire and the temporary substrate is SOI.

16. The method of claim 12, wherein the bonding structure is an oxide to oxide bond or oxide to nitride bond.

17. The method of claim 12, wherein the temporary substrate is removed by grinding and wet etching processes.

18. The method of claim 1, wherein the permanent electrically insulative substrate is glass.

19. The method of claim 9, further comprising:
    removing the releaseable wafer by laser ablation; and
    removing the releaseable adhesive by grinding and etching processes.

20. The method of claim 19, wherein:
    the device layer and the substrate have a total thickness of about 700 microns;
    the permanent substrate has a thickness between about 700 microns and about 750 microns; and
    the bonding structure and the releasable adhesive withstand temperatures to about 350° C.

21. The method of claim 1, further comprising removing the adhesive using an ashing process.

* * * * *